United States Patent [19]

Stewart et al.

[11] Patent Number: 4,577,215
[45] Date of Patent: Mar. 18, 1986

[54] DUAL WORD LINE, ELECTRICALLY ALTERABLE, NONVOLATILE FLOATING GATE MEMORY DEVICE

[75] Inventors: Roger G. Stewart, Neshanic Station; Alfred C. Ipri, Princeton, both of N.J.

[73] Assignee: RCA Corporation, Princeton, N.J.

[21] Appl. No.: 467,643

[22] Filed: Feb. 18, 1983

[51] Int. Cl.[4] ............................................. H01L 29/78
[52] U.S. Cl. .................... 357/23.5; 357/23.6; 357/54; 357/59; 357/67; 365/185
[58] Field of Search ........... 357/23.5, 23.6, 54, 357/59, 67.5; 365/184, 185

[56] References Cited

U.S. PATENT DOCUMENTS

| | | | |
|---|---|---|---|
| 3,500,142 | 3/1970 | Kahng | 317/235 |
| 4,099,196 | 7/1978 | Simko | 357/23 |
| 4,282,446 | 8/1981 | McElroy | 357/23 VT |
| 4,314,265 | 2/1982 | Simko | 357/23 |
| 4,355,375 | 10/1982 | Arakawa | 365/185 |
| 4,395,724 | 7/1983 | Iwahashi et al. | 357/23 VT |
| 4,422,092 | 12/1983 | Guterman | 357/23 VT |

FOREIGN PATENT DOCUMENTS 151792 7/1978 United Kingdom .
204927 12/1980 United Kingdom .
2092378 8/1982 United Kingdom .

OTHER PUBLICATIONS

"16-K EE-PROM Relies on Tunneling for Byte-Erasable Program Storage", W. S. Johnson et al., Electronics, Feb. 28, 1980, pp. 113-117.

Primary Examiner—Joseph E. Clawson, Jr.
Attorney, Agent, or Firm—Birgit E. Morris; William J. Burke; Henry Steckler

[57] ABSTRACT

A structure having dual word line, electrically alterable, nonvolatile floating gate memory cell is described wherein the word-line-to-floating gate capacitance is made significantly greater than either the program-line-to-floating gate capacitance or the floating-gate-to-substrate capacitance. This allows the program line and word line to be counter driven to minimize coupling to the floating gate during the write/erase cycle and to maximize coupling during the read cycle. The net result is higher write/erase/read efficiencies than heretofore possible.

5 Claims, 5 Drawing Figures

DUAL WORD LINE, ELECTRICALLY ALTERABLE, NONVOLATILE FLOATING GATE MEMORY DEVICE

BACKGROUND OF THE INVENTION

This invention relates, in general, to semiconductor memory devices and more particularly, to electrically alterable, nonvolatile floating gate memory devices.

The microprocessor based systems, as well as the related arts, have long required electrically alterable read only memory (EAROM) elements that were nonvolatile and many such devices have, to some extent, filled this need. However, as the computer arts have become more complex in nature and have required high speeds and greater capacity there now exists the need for a high density memory device that may be easily programmed or "written" and, as the occasion arises, to reprogram ("erase" and "rewrite") the device in the field. To this end, devices are presently available to the design engineers that exhibit nonvolatile characteristics but, as will be discussed, the have inherent shortcomings that are overcome by the subject invention.

One such device is found in the family of Floating Gate Avalanche Metal Oxide Semiconductor (FAMOS) devices. The advantage of this type of device resides in the fact that it is independent of any outside current to maintain the stored information in the event power is lost or interrupted. Since these devices are independent of any outside power there is also no need to refresh the device which feature results in a significant savings in power.

The floating gate family of devices usually has source and drain regions of a given conductivity type, formed in a substrate of the opposite conductivity type, at the surface thereof. Between the source and drain regions, and on the surface of the substrate, a gate structure is formed by first applying a thin insulating layer followed by a conductive layer (the floating gate) followed by a second insulating layer in order to completely surround the floating gate and insulate it from the remainder of the device. A second conductive layer (usually referred to as the control gate) is formed over the second insulating layer (in the region of the floating gate) to complete the gate structure. Once such device is exemplified in U.S. Pat. No. 3,500,142 which issued to D. Kahng on Mar. 10, 1970 represents one of the early attempts to achieve nonvolatility.

The major drawback of the prior art devices resides in the fact that high fields are required to produce the necessary avalanche breakdown in order for charge to be placed on the floating gate. Further, to erase charge placed on the floating gate, certain of the prior art devices were provided with a transparent window so that the chip may be flooded with energy in the ultra violet or x-ray portion of the spectrum. Thus, it is extremely difficult to erase a single "word" without erasing all the charge on the device then requiring that the entire chip be completely reprogrammed. Further, the erasing step required an extremely long period of exposure time, of the order of about 30 to 45 minutes, with the device or chip removed from the equipment.

In recent years, the art has progressed to the point where nonvolatile, floating gate read only memory devices have been produced which are electrically alterable. One such memory cell has been described in detail in an article entitled "16-K EE$^2$PROM Relies on Tunneling for Byte-Erasable Program Storage" by W. S. Johnson, et al., ELECTRONICS, Feb. 28, 1980, pp. 113–117. In this article the authors describe a "Floating-Gate Tunnel Oxide" structure wherein a cell using a polycrystalline silicon (polysilicon) floating gate structure has its gate member charged with electrons (or holes) through a thin oxide layer positioned between the floating gate and the substrate by means of the Fowler-Nordheim tunneling mechanism. An elevation view of a typical device is described, and shown in FIG. 1 of the article. By using this type of structure, an excessively high floating gate-to-substrate capacitance is produced. However, acceptably low "write" and "erase" operations can only be achieved when most of the applied voltage appears across the tunnel region which, in turn, requires that the floating gate-to-control gate capacitance be larger than the floating gate-to-substrate capacitance. Further, to achieve the required distribution of capacitance to produce the acceptable write and erase characteristics, the prior art has resorted to extending both the first and second polysilicon levels over the adjacent field oxide to obtain additional capacitance. The net result is an undesirably large cell.

In a patent application published in the United Kingdom as UK Patent Application GB No. 2,092,378A on Aug. 11, 1982, in the name of Xicor Inc. and entitled "Dense Nonvolatile Electrically-Alterable Memory Device with Substrate Coupling Electrode", the author describes a floating gate nonvolatile memory fabricated with three layers of polycrystalline silicon (poly). A fourth layer, embedded in the substrate surface is used to bias the floating gate during the write, erase, and read operations. The mechanism for programming the device relys on asperities formed on the upper surface of the first poly level (the programming electrode) to inject charge into the second poly level (the floating gate). To erase the charge, asperities on the upper surface of the floating gate are used to induce charge to migrate from the floating gate to an overlying third poly level which functions as the select/erase electrode. The asperities which texture the surface of the poly layers tend to locally intensify the electric fields thereby lowering the effective polycrystalline silicon barrier height. However, this results in a compromise between read effectiveness and write/erase effectiveness. To merely alter the capacitance in order to improve the effectiveness of either the read operation or the write/erase operation will tend to degrade the operation of the other.

SUMMARY OF THE INVENTION

We have found that, by utilizing the structure of our dual line, electrically alterable, nonvolatile floating gate memory cell wherein the word-line-to-floating gate capacitance is made significantly greater than either the program-line-to-floating gate capacitance or the floating-gate-to-substrate capacitance and by counter driving each line (the program line and word line) we are able to minimize the coupling to the floating gate during a write or erase cycle and maximize the coupling during the read cycle in order to provide a cell having higher write/erase/read efficiencies than heretofore possible.

DETAILED DESCRIPTION OF THE PREFERRED EMBODIMENT

Figure 1:
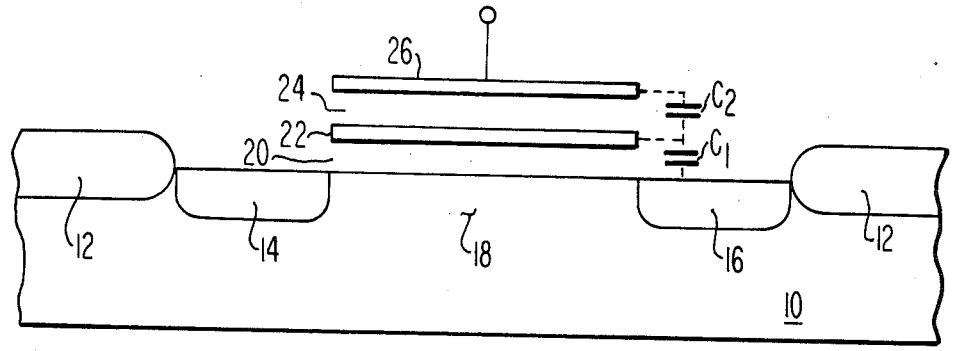
FIG. 1 is a schematic representation of the prior art floating gate memory device indicating the capacitive distribution with respect to the control gate, floating gate and the substrate.

Referring now to FIG. 1 there is shown a schematic representation of a prior art floating gate device wherein asperities on the upper surface of a poly floating gate are used to intensify the electric fields in an effort to lower the effective barrier height. This prior art device is formed in a substrate 10 of a first conductivity type, the substrate being provided with a layer of field oxide 12 on the top surface thereof to define the active areas and to insulate one cell from another. The active areas consist of source and drain regions 14 and 16 respectively which regions are formed of a conductivity type opposite of that of the substrate. These regions may be formed either by ion implantation or by diffusion. An intermediate region 18 is thus provided between source and drain regions 14 and 16 and, as is well known in the art, is made to support conduction by an inversion layer at the surface of substrate 10. A layer of gate oxide 20 is provided as an insulator for floating gate 22, which is usually a doped poly layer. Similarly, an inter-poly insulating oxide layer 24 is provided in order to insulate poly layer 26 from poly layer 22. As is well known in the art, poly layer 26 is usually referred to as the control gate while poly layer 22 is identified as the floating gate.

Since poly layers 22 and 26 are conductive layers that are separated by insulating layer 24, the capacitance resulting from the cooperation of these three elements may be determined by the areas of overlap of the layers and the thickness and quality of insulating oxide layer 24. This is represented by $C_2$. Similarly, the capacitance formed by the cooperation of poly layer 22, oxide layer 20 and substrate 10 is shown as $C_1$. In the conventional planar poly-injector cells, the capacitive coupling elements $C_1$ and $C_2$ are about equal. When a potential of about 20 volts is applied between poly layer 26 and substrate 10 (to write or erase charge on floating gate 22) the 20 volts will be divided equally with about 10 volts appearing across inter-poly oxide layer 24 ($C_2$), where it contributes to tunneling, while the remaining 10 volts appears across the gate oxide layer 20 ($C_1$), where it is effectively wasted. During the read cycle the situation is reversed, in that when a 5 volt read signal is applied, half of the voltage will occur across inter-poly oxide layer 24 ($C_2$). Thus, only the 2½ volt potential appearing across gate oxide 20 ($C_1$) serves to control the channel. Since $C_1=C_2$ the efficiency may be expressed as follows:

$$\text{read efficiency} = C_1/(C_1+C_2) = 50\% \tag{1}$$

$$\text{erase/write efficiency} = C_2/(C_1+C_2) = 50\% \tag{2}$$

It should now be obvious that if the capacitance distribution is altered to improve either the read efficiency or the erase/write efficiency such improvement in one operation will degrade operation in the other.

Figure 2:
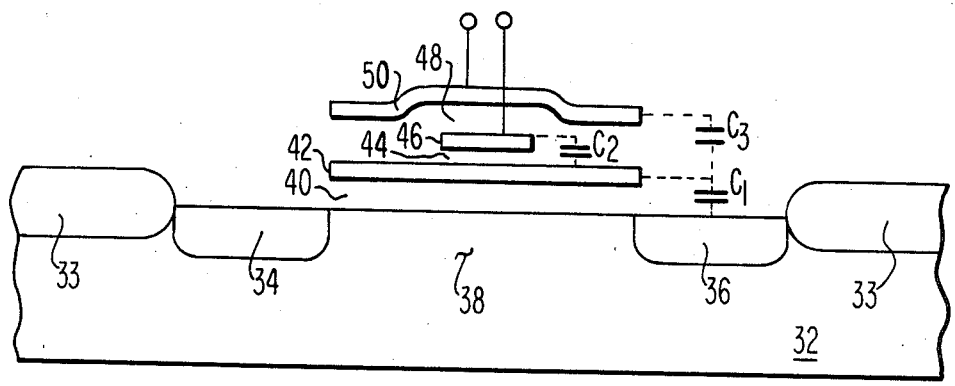
FIG. 2 is a schematic representation of the floating gate memory device of the subject invention, indicating the capacitive distribution achieved therein.

Referring now to FIG. 2 there is shown, schematically, the floating gate memory device of the subject invention where both higher read efficiency and higher erase/write efficiencies are achieved using the dual lines (word and program) herein shown. In our device, a substrate 32 of a first conductivity type is provided with source and drain regions 34 and 36, together with an intermediate channel region 38 for supporting conduction. Field oxide 33 also serves to define the active region and to separate and insulate one active region from the other. Gate oxide layer 40 is provided on the surface of substrate 32 over the active region and has a thickness of about 500 angstroms and serves to insulate poly layer (floating gate) 42 from substrate 32. The resultant capacitance is here designated as $C_1$. Poly layer (program line) 46 is insulated from floating gate 42 by inter-poly oxide layer 44 which may have a thickness of about 200 angstroms. The resultant capacitance is here desingated as $C_2$. Poly layer 46 is insulated from poly layer (word line) 50 by oxide layer 48 which may have a thickness of about 500 angstroms and the capacitance between poly layers 42 and 50 is here designated as $C_3$.

As will be seen in subsequent Figures, the dimensions of poly layer 50, with respect to poly layers 42 and 46 have been tailored in order to meet the following conditions:

$$C_3 = xC_2 = yC_1 \tag{3}$$

and $$C_2 < C_3 > C_1 \tag{4}$$

Where:
$x > 1; y > 1;$

Further, when performing the write or erase functions, poly layers 46 and 50 are counter-driven to maximize the electric field between poly layer 46 and poly layer 42 (across oxide layer 44). During the read operation poly layers 46 and 50 are driven together to maximize the electric field across gate oxide layer 40.

The following table shows the nominal potentials that may be applied to each of the elements of our device in order to perform the erase, write and read functions. In the table the various potentials shown in each of the columns are applied to the elements shown in the columns entitled "ELEMENT".

| ELEMENT | WRITE | ERASE | READ |
| --- | --- | --- | --- |
| Source 34/Drain 36/and Substrate 32 | 0/0/0 v | 20/20/20 v | 0/2.5/0 v |
| Poly Line 46 | 20 v | 0 v | 5 v |
| Poly Line 50 | 0 v | 20 v | 5 v |

Thus, in the cell shown in FIG. 2 where, by way of example, x and y equal 3, then:

$$C_3 = 3C_2 = 3C_1 \tag{5}$$

The efficiencies may then be expressed as follows:

$$\text{write efficiency} = \frac{C_2 + C_3}{C_1 + C_2 + C_3} = 80\% \tag{6}$$

The erase efficiency will be similar to the above write efficiency (6) except, as shown in the above table, the voltage applied to poly layers 46 and 50 are reversed. With the capacitance ratio shown, the erase efficiency should be about equal to the write efficiency. Thus, with a 20 volt applied to the cell of the subject application a total of about 16 volts is available for writing and erasing the cell instead of only 10 volts that was available in the prior art.

During read operation, as shown in the table, poly lines 46 and 50 have 5 volts applied thereto and 2.5 volts is applied to drain 36. Under these circumstances with poly lines 46 and 50 having 5 volts applied thereto they are driven together in order to maximize the field appearing across oxide layer 40. The read efficiency may now be expressed as follows:

$$\text{read efficiency} + \frac{C_1 + C_3}{C_1 + C_2 + C_3} = 80\% \qquad (7)$$

The net result of this higher read efficiency is to provide a 4 volt signal for decoding the channel region instead of the 2.5 volts available to the prior art.

Accordingly, by tailoring the various capacitances, we are able to effectively alter the capacitance distribution ratio in order to make it higher for both the read operation and the write/erase operations than possible with the prior art. Both read and write/erase operations are then faster, safer, and more efficient. Also, when poly layers 46 and 50 are driven together (the same voltage of the same polarity applied thereto) the induced potential across tunnel oxide 44 is reduced to only 1 volt during the read operation. This will greatly reduce the likelihood of any smearing along unselected word lines during a write/erase operation and further reduces the likelihood of disturbing adjacent cells during a read operation.

Figure 3:
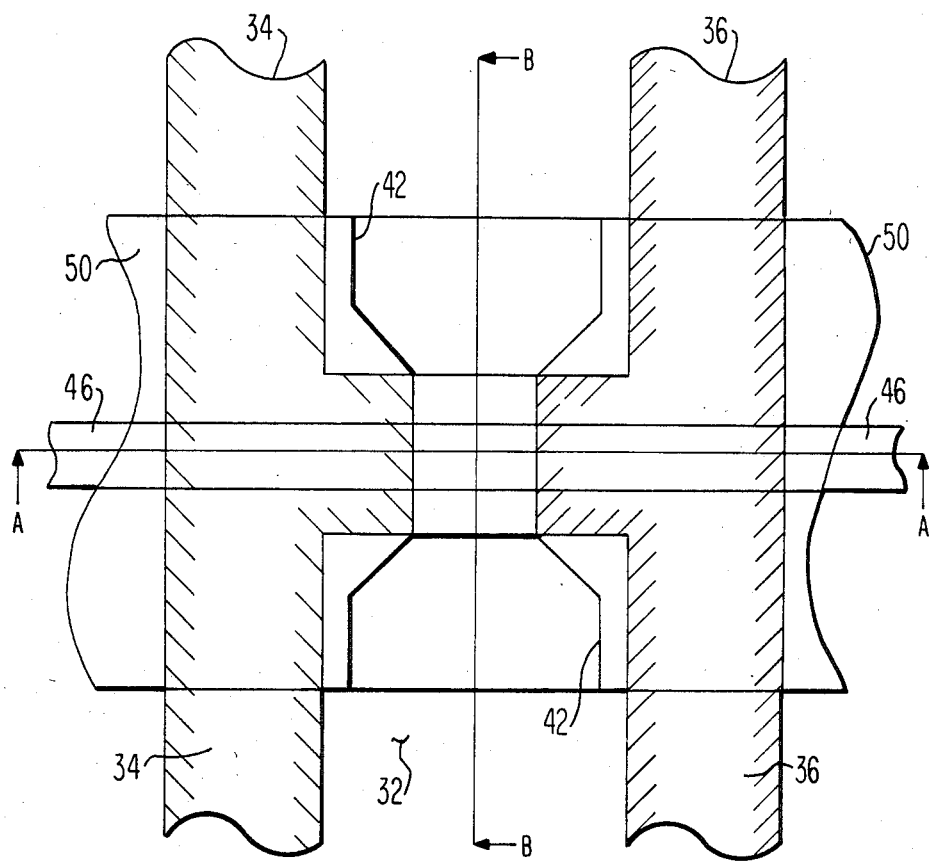
FIG. 3 is a plan view of a floating gate memory device made in accordance with the teachings of the subject invention.
Figure 3A:
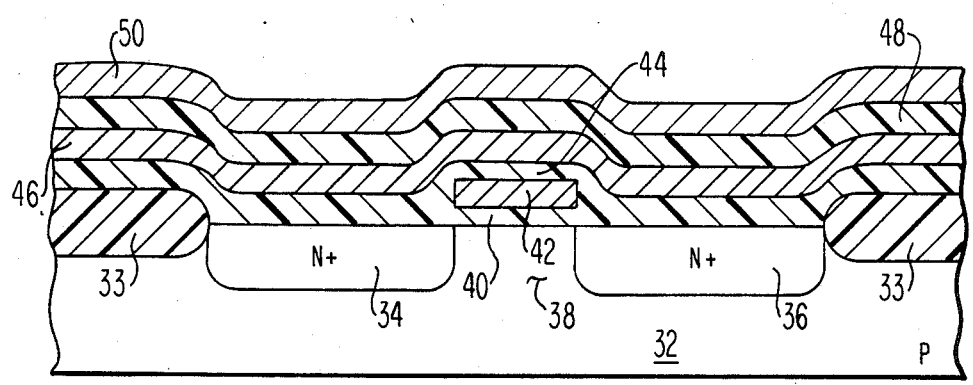
FIG. 3A is a cross-sectional, elevation view of the device of FIG. 3 taken along line A—A of FIG. 3.
Figure 3B:
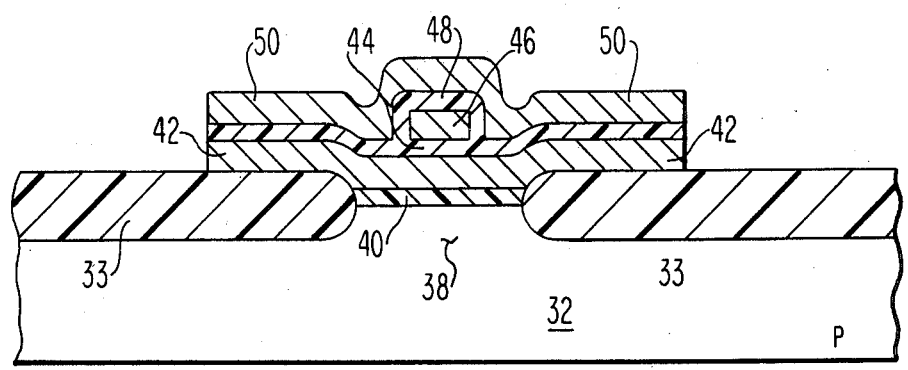
FIG. 3B is a cross-sectional view of the device of FIG. 3 taken along line B—B of FIG. 3.

Referring now to FIGS. 3, 3A, and 3B there is shown a P type substrate 32 with parallel N doped lines 34 and 36 representing the source and drain respectively. The source and drain regions 34 and 36 are separated by channel region 38 which is made to support conduction by an inversion layer, as is well known in the art. The active region, consisting of source and drain regions 34, 36 and channel region 38 is defined by field oxide layer 33 which is formed on the top surface of substrate 32. While the active region is shown having been formed in a P type substrate, those skilled in the art will readily recognize that the P region designated as 32 may also be a P well formed in a N type substrate.

A layer of gate oxide 40 having a thickness of about 500 angstroms is formed over both the active region and field oxide 33. A doped poly layer is then formed on oxide layer 40, masked and defined to form an "hour-glass" shaped floating gate 42 in order to tailor the floating gate-to-substrate capacitance. The narrow portion of the "hour-glass" being aligned with channel region 38. The capacitance formed between floating gate 42 and substrate 32 is equivalent to $C_1$ in FIG. 2. While we have chosen to tailor floating gate 42 to have an hour glass configuration, we do not wish to be so limited. Any other shape will suffice provided the criteria of Equations (4) and (5) are met.

A second layer of oxide 44 having a thickness of about 200 angstroms is then formed over floating gate 42 as well as over gate oxide 40 and field oxide 33. Thereafter, another doped polysilicon layer is deposited, masked and defined to form program line 46 which runs in a direction generally perpendicular to floating gate 42. The combination of the overlap of program line 46 over floating gate 42 together with oxide layer 44 constitutes capacitance $C_2$. Program line 46 is then provided with a layer of oxide 48 which is deposited over the entire structure to a thickness of about 500 angstroms followed by the deposition of a doped layer which is masked and defined to form word line 50. Word line 50 has its outer edges aligned with the ends of floating gate 42 in order to maximize the word-line-to-floating gate capacitance. The resultant capacitance is here designated as $C_3$.

Although it has not been shown, those skilled in the art will recognize that source line 34, drain line 36, poly (program) line 46 and poly (word) line 50 all terminate in insulated pads (not shown) at the edges of substrate 32 in order to provide the appropriate signals to write, erase and read the cell. Further, a protective passivating layer may be applied over poly layer 50 to protect it from the atmosphere.

Additionally, while we have shown and described our device as being formed in bulk silicon, those skilled in the art will readily recognize that the cell described may be fabricated on an insulative substrate such as sapphire, spinel or monocrystalline beryllium oxide.

While we have described the operation of a single device, it should be obvious to those skilled in the art that a plurality of these devices may be assembled in rows and columns to form an array. One such array is illustrated in FIG. 4 of our copending application Ser. No. 448,690 now U.S. Pat. No. 4,513,397 filed Dec. 10, 1982 and assigned to the same assignee as the subject application. In our copending application we show an example of how a memory device may be arranged in a single well. In the subject application the common source and drain lines (34 and 36) would be shared by all the devices in one column, while remaining columns in the well would have their respective sources and drains similarly shared. Program line 46 and word line 50 would be common to each device in corresponding rows in each column. Thus, to form a 1024-bit array, one would form 32 columns of shared sources and drains with 32 devices in each row connected to program and word lines. However, each device would have its own floating gate member 42. Accordingly, by appropriately biasing the source and drain lines 34 and 36 as well as substrate 32, as shown in the table, one could very easily "write", "erase" or "read" any one of the 1024 devices present.

While we have chosen to describe our device in terms of multiple layers of poly(polycrystalline silicon), we do not wish to be so limited. It should now be obvious to those skilled in the art that various other conductive layers formed of refractory metals, refractory metal silicides etc, or any combination thereof, may be used in place of poly layers 46 and 50.

What we claim is:

1. A non-volatile electrically erasable, programmable floating gate memory device having a body of semiconductor material of a first conductivity type with extended, parallel source and drain regions of a second conductivity type embedded in the body of semiconductor material at a surface thereof and spaced one from the other to define a channel region, a conductive floating gate member oriented parallel to said surface and insulated from the substrate and having a portion thereof disposed over the channel region, a conductive program line having a portion thereof disposed over and insulated from the floating gate member and a conductive word line disposed over and insulated from the conductive program line, comprising:

a portion of the floating gate being oriented in a direction parallel to the extended source and drain regions and aligned with the channel region;

the program line being disposed under and parallel to the word line over the channel region with both lines perpendicularly disposed with respect to the orientation of the floating gate;

the ends of the floating gate being aligned with the width of the word line; and the capacitance values of the floating gate, the word and program lines and the substrate having the relationship:

$$C_2 < C_3 > C_1$$

where:
$C_1$ = the floating gate-to-substrate capacitance,
$C_2$ = the program line-to-floating gate capacitance; and
$C_3$ = the word line-to-floating gate capacitance.

2. The memory device of claim 1, wherein: the conductive floating gate and the program and word lines are selected from the group consisting of doped polycrystalline silicon, refractory metals and refractory metal silicides.

3. The floating gate memory device of claim 1, wherein:

the floating gate is insulated from the channel region by a layer of silicon oxide of the order of about 500 angstroms;

the program line is insulated from the floating gate by a layer of silicon oxide of the order of about 200 angstroms; and the word line is insulated from the program line by a layer of silicon the order of about 500 angstroms.

4. The floating gate memory device of claim 3, wherein:

the substrate is doped with P type conductivity modifiers; and the source and drain regions are doped with N type conductivity modifiers.

5. The floating gate memory device of claim 4, wherein:

the floating gate is "hour-glass" shaped with the narrow portion thereof aligned with the channel region.

* * * * *